United States Patent
Li et al.

(10) Patent No.: US 9,416,298 B2
(45) Date of Patent: Aug. 16, 2016

(54) PROCESS FOR THE MANUFACTURE OF SEMICONDUCTOR DEVICES COMPRISING THE CHEMICAL MECHANICAL POLISHING (CMP) OF III-V MATERIAL IN THE PRESENCE OF A CMP COMPOSITION COMPRISING A SPECIFIC NON-IONIC SURFACTANT

(71) Applicant: BASF SE, Ludwigshafen (DE)

(72) Inventors: Yuzhuo Li; Bastian Marten Noller, Lorsch (DE); Christophe Gillot, Bierbeek (BE); Diana Franz, Schifferstadt (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/402,975

(22) PCT Filed: May 21, 2013

(86) PCT No.: PCT/IB2013/054169
§ 371 (c)(1),
(2) Date: Nov. 21, 2014

(87) PCT Pub. No.: WO2013/175396
PCT Pub. Date: Nov. 28, 2013

(65) Prior Publication Data
US 2015/0175845 A1    Jun. 25, 2015

Related U.S. Application Data

(60) Provisional application No. 61/650,502, filed on May 23, 2012.

(51) Int. Cl.
| | | |
|---|---|---|
| *C09G 1/02* | (2006.01) | |
| *H01L 21/304* | (2006.01) | |
| *H01L 21/302* | (2006.01) | |
| *H01L 21/321* | (2006.01) | |
| *H01L 21/461* | (2006.01) | |
| *H01L 21/306* | (2006.01) | |
| *H01L 21/02* | (2006.01) | |

(52) U.S. Cl.
CPC ............ *C09G 1/02* (2013.01); *H01L 21/02024* (2013.01); *H01L 21/302* (2013.01); *H01L 21/304* (2013.01); *H01L 21/30625* (2013.01); *H01L 21/3212* (2013.01); *H01L 21/461* (2013.01); *B81C 2201/0121* (2013.01); *B81C 2201/0123* (2013.01); *B81C 2201/0126* (2013.01)

(58) Field of Classification Search
None
See application file for complete search history.

(56) References Cited

U.S. PATENT DOCUMENTS

| | | | |
|---|---|---|---|
| 2007/0185256 A1 | 8/2007 | Wulff et al. | |
| 2008/0115422 A1* | 5/2008 | Suzuki | C08F 220/26 51/298 |
| 2008/0124913 A1 | 5/2008 | Choi et al. | |

FOREIGN PATENT DOCUMENTS

| | | | |
|---|---|---|---|
| CN | 101081966 A | | 12/2007 |
| CN | 101096571 A | | 1/2008 |
| CN | 101591509 A | | 12/2009 |
| JP | 2002-25954 | | 1/2002 |
| JP | 2003-100671 | * | 4/2003 |
| JP | 2003-100671 A | | 4/2003 |
| KR | 10-2008-0037802 A | | 5/2008 |
| WO | WO 2004/063301 A1 | | 7/2004 |
| WO | WO 2012/046179 A1 | | 4/2012 |

OTHER PUBLICATIONS

International Search Report issued Oct. 3, 2013 in PCT/IB2013/054169.
U.S. Appl. No. 14/394,870, filed Oct. 16, 2014, Franz, et al.

* cited by examiner

*Primary Examiner* — Stephanie Duclair
(74) *Attorney, Agent, or Firm* — Oblon, McClelland, Maier & Neustadt, L.L.P.

(57) ABSTRACT

A process for the manufacture of semiconductor devices comprising the chemical-mechanical polishing of a substrate or layer containing at least one III-V material in the presence of a chemical-mechanical polishing composition (Q1) comprising (A) inorganic particles, organic particles, or a mixture or composite thereof, (B) at least one amphiphilic non-ionic surfactant having (b1) at least one hydrophobic group; and (b2) at least one hydrophilic group selected from the group consisting of polyoxyalkylene groups comprising (b22) oxyalkylene monomer units other than oxyethylene monomer units; and (M) an aqueous medium.

12 Claims, No Drawings

PROCESS FOR THE MANUFACTURE OF SEMICONDUCTOR DEVICES COMPRISING THE CHEMICAL MECHANICAL POLISHING (CMP) OF III-V MATERIAL IN THE PRESENCE OF A CMP COMPOSITION COMPRISING A SPECIFIC NON-IONIC SURFACTANT

FIELD OF THE INVENTION

This invention essentially relates to a process for the manufacture of semiconductor devices comprising the chemical mechanical polishing (abbreviated as CMP in the following) of III-V material in the presence of a CMP composition comprising a specific non-ionic surfactant, and its use in polishing substrates of the semiconductor industry which comprise III-V material.

DESCRIPTION OF THE PRIOR ART

In the semiconductor industry, chemical mechanical polishing is a well-known technology applied in fabricating advanced photonic, microelectromechanical, and microelectronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

In the state of the art, processes comprising the chemical mechanical polishing of a III-V material in the presence of a CMP composition comprising a non-ionic surfactant are known and described, for instance, in the following references.

CN 101096571 A discloses an alkaline composition for polishing GaAs having a pH value of 11 to 12 and comprising abrasive, pH regulator, water, and fatty alcohol polyoxyethylene ether or alkyl alcohol amide (alkanolamide) as non-ionic surfactant.

CN 101081966 A discloses an alkaline composition for polishing GaAs having a pH value of 11 to 12 and comprising abrasive, pH regulator, chelating agent, water, and fatty alcohol polyoxyethylene ether or alkyl alcohol amide (alkanolamide) as non-ionic surfactant.

JP 2002-025954 A discloses an alkaline composition for polishing GaAs comprising
  polyethylene glycol —$(CH_2CH_2O)_n$(n≥1),
  or 2-methoxyethanol $CH_3O(CH_2CH_2O)H$,
  or N,N-diethanol methanamide $CH_3N(CH_2CH_2OH)_2$,
  or a mixture of 2-methoxyethanol and N,N-diethanol methanamide as non-ionic surfactant.

US 2008/124913 A1 discloses an abrasive slurry including a non-ionic surfactant that selectively forms a passivation layer on the polysilicon layer and a method for removing an upper portion of a polysilicon layer formed over a pattern to form a polished polysilicon surface.

OBJECTS OF THE INVENTION

One of the objects of the present invention was to provide a CMP composition and a CMP process appropriate for the chemical-mechanical polishing of III-V materials, particularly GaAs substrates, and showing an improved polishing performance, especially
(i) a high material removal rate (MRR) of the III-V material, for example GaAs,
(ii) a low static etch rate (SER) of the III-V material, for example GaAs,
(iii) high surface quality of the III-V material, for example GaAs, after the CMP step,
(iv) safe handling and reduction of hazardous by-products—for example the toxic gas $AsH_3$ in case of GaAs polishing—to a minimum, or
(v) or the combination of (i), (ii), (iii) and (iv).

Moreover, a CMP process was sought that is easy to apply and requires as few steps as possible.

SUMMARY OF THE INVENTION

Accordingly, a process for the manufacture of semiconductor devices comprising the chemical-mechanical polishing of a substrate or layer containing at least one III-V material in the presence of a CMP composition (Q1) comprising
(A) inorganic particles, organic particles, or a mixture or composite thereof,
(B) at least one amphiphilic non-ionic surfactant having
  (b1) at least one hydrophobic group; and
  (b2) at least one hydrophilic group selected from the group consisting of polyoxyalkylene groups comprising
    (b22) oxyalkylene monomer units other than oxyethylene monomer units; and
(M) an aqueous medium.

Moreover, the use of the CMP composition (Q1) for chemical-mechanical polishing of a substrate or layer containing at least one III-V material was found.

On the other hand, a process for the manufacture of semiconductor devices comprising the chemical-mechanical polishing of a substrate or layer containing at least one III-V material in the presence of a CMP composition (Q2) comprising
(A) inorganic particles, organic particles, or a mixture or composite thereof,
(C) at least one amphiphilic non-ionic polyoxyethylene surfactant having
  (c1) at least one hydrophobic group which is an alkyl group having not more than 8 carbon atoms; and
  (c2) at least one hydrophilic group which is a polyoxyethylene group; and
(M) an aqueous medium.

Furthermore, the use of the CMP composition (Q2) for chemical-mechanical polishing of a substrate or layer containing at least one III-V material was found.

Preferred embodiments are explained in the claims and the specification. It is understood that combinations of preferred embodiments are within the scope of the present invention.

A semiconductor device can be manufactured by the process of the invention, said process comprises the chemical mechanical polishing of a substrate or layer—preferably a layer—containing at least one III-V material in the presence of the CMP composition (Q1) or (Q2). If the III-V material has the shape of a layer, the content of all III-V material contained in the layer is preferably more than 90%, more preferably more than 95%, most preferably more than 98%, particularly more than 99%, for example more than 99.9% by weight of the corresponding layer. A III-V material is a material consisting of at least one group 13 element (including Al, Ga, In) and at least one group 15 element (including N, P, As, Sb). Thus in other words according to the invention a III-V material is a combination of at least one group 13 element and of at least one group 15 element. The terms "group 13" and "group 15" refer to the current IUPAC convention for naming the groups in the periodic table of chemical elements. Preferably, said III-V material is GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, or GaInAsSb. More preferably, said III-V material is GaN, GaP, GaAs, GaSb, InP, InAs, InSb, InGaAs, or InAlAs. Most preferably, said III-V material is GaN, GaP, GaAs, GaAs, InP, or InAs. Particularly, said III-V material is GaAs (gallium arsenide).

The CMP composition (Q1) or (Q2) is used for chemical-mechanical polishing of a substrate or layer containing at least one III-V material, preferably for chemical-mechanical polishing of a layer containing at least one III-V material. If the III-V material has the shape of a layer, the content of all III-V material contained in the layer is preferably more than 90%, more preferably more than 95%, most preferably more than 98%, particularly more than 99%, for example more than 99.9% by weight of the corresponding layer. Preferably, said III-V material is GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, or GaInAsSb. More preferably, said III-V material is GaN, GaP, GaAs, GaSb, InP, InAs, InSb, InGaAs, or InAlAs. Most preferably, said III-V material is GaN, GaP, GaAs, GaAs, InP, or InAs. Particularly, said III-V material is GaAs (gallium arsenide).

The CMP composition (Q1) comprises the components (A), (B), (M) and optionally further components as described below.

The CMP composition (Q2) comprises the components (A), (C), (M) and optionally further components as described below.

The CMP composition (Q1) or (Q2) comprises inorganic particles, organic particles, or a mixture or composite thereof (A). (A) can be
  of one type of inorganic particles,
  a mixture or composite of different types of inorganic particles,
  of one type of organic particles,
  a mixture or composite of different types of organic particles, or
  a mixture or composite of one or more types of inorganic particles and one or more types of organic particles.

A composite is a composite particle comprising two or more types of particles in such a way that they are mechanically, chemically or in another way bound to each other. An example for a composite is a core-shell particle comprising one type of particle in the outer sphere (shell) and another type of particle in the inner sphere (core).

Generally, the particles (A) can be contained in varying amounts in the CMP composition (Q1) or (Q2). Preferably, the amount of (A) is not more than 10 wt. % (wt. % stands for "percent by weight"), more preferably not more than 7 wt. %, most preferably not more than 5 wt. %, particularly not more than 3 wt. %, for example not more than 1.5 wt. %, based on the total weight of the composition (Q1) or (Q2). Preferably, the amount of (A) is at least 0.002 wt. %, more preferably at least 0.01 wt. %, most preferably at least 0.08 wt. %, particularly at least 0.4 wt. %, for example at least 0.7 wt. %, based on the total weight of the composition (Q1) or (Q2).

Generally, the particles (A) can be contained in varying particle size distributions. The particle size distributions of the particles (A) can be monomodal or multimodal. In case of multimodal particle size distributions, bimodal is often preferred. In order to have an easily reproducible property profile and easily reproducible conditions during the CMP process of the invention, a monomodal particle size distribution is preferred for (A). It is most preferred for (A) to have a monomodal particle size distribution.

The mean particle size of the particles (A) can vary within a wide range. The mean particle size is the $d_{50}$ value of the particle size distribution of (A) in the aqueous medium (M) and can be determined using dynamic light scattering techniques. Then, the $d_{50}$ values are calculated under the assumption that particles are essentially spherical. The width of the mean particle size distribution is the distance (given in units of the x-axis) between the two intersection points, where the particle size distribution curve crosses the 50% height of the relative particle counts, wherein the height of the maximal particle counts is standardized as 100% height.

Preferably, the mean particle size of the particles (A) is in the range of from 5 to 500 nm, more preferably in the range of from 10 to 400 nm, most preferably in the range of from 20 to 300 nm, in particular in the range of from 30 to 160 nm, for example in the range of from 35 to 135 nm, as measured with dynamic light scattering techniques using instruments such as High Performance Particle Sizer (HPPS) from Malvern Instruments, Ltd. or Horiba LB550.

The particles (A) can be of various shapes. Thereby, the particles (A) may be of one or essentially only one type of shape. However, it is also possible that the particles (A) have different shapes. For instance, two types of differently shaped particles (A) may be present. For example, (A) can have the shape of cubes, cubes with chamfered edges, octahedrons, icosahedrons, cocoons, nodules or spheres with or without protrusions or indentations. Preferably, they are spherical with no or only very few protrusions or indentations. According to another embodiment, they are preferably cocoon-shaped. Cocoon-shaped particles are particles with a minor axis of from 10 to 200 nm and ratio of major/minor axis of 1.4 to 2.2.

The chemical nature of particles (A) is not particularly limited. (A) may be of the same chemical nature or a mixture or composite of particles of different chemical nature. As a rule, particles (A) of the same chemical nature are preferred. Generally, (A) can be
  inorganic particles such as a metal, a metal oxide or carbide, including a metalloid, a metalloid oxide or carbide, or
  organic particles such as polymer particles,
  a mixture or composite of inorganic and organic particles.
Particles (A) are
  preferably inorganic particles, or a mixture or composite thereof,
  more preferably oxides and carbides of metals or metalloids, or a mixture or composite thereof,
  most preferably alumina, ceria, copper oxide, iron oxide, nickel oxide, manganese oxide, silica, silicon nitride, silicon carbide, tin oxide, titania, titanium carbide, tungsten oxide, yttrium oxide, zirconia, or a mixture or composites thereof,
  particularly preferably alumina, ceria, silica, titania, zirconia, or a mixture or composite thereof,
  in particular silica particles,
  for example colloidal silica particles.

Typically, colloidal silica particles are produced by a wet precipitation process.

In another embodiment in which (A) are organic particles, or a mixture or composite of inorganic and organic particles, polymer particles are preferred as organic particles. Polymer particles can be homo- or copolymers. The latter may for example be block-copolymers, or statistical copolymers. The homo- or copolymers may have various structures, for instance linear, branched, comb-like, dendrimeric, entangled or cross-linked. The polymer particles may be obtained according to the anionic, cationic, controlled radical, free radical mechanism and by the process of suspension or emulsion polymerisation. Preferably, the polymer particles are at least one of the polystyrenes, polyesters, alkyd resins, polyurethanes, polylactones, polycarbonates, poylacrylates, polymethacrylates, polyethers, poly(N-alkylacrylamide)s, poly (methyl vinyl ether)s, or copolymers comprising at least one of vinylaromatic compounds, acrylates, methacrylates, maleic anhydride acrylamides, methacrylamides, acrylic acid, or methacrylic acid as monomeric units, or a mixture or composite thereof. Among them, polymer particles with a cross-linked structure are preferred.

The CMP composition (Q1) comprises at least one amphiphilic non-ionic surfactant (B) having
(b1) at least one hydrophobic group; and
(b2) at least one hydrophilic group selected from the group consisting of polyoxyalkylene groups comprising
(b22) oxyalkylene monomer units other than oxyethylene monomer units.

The amphiphilic non-ionic surfactant (B) is preferably water-soluble and/or water-dispersible, more preferably water-dispersible. "Water-soluble" means that the relevant component or ingredient of the composition of the invention can be dissolved in the aqueous phase on the molecular level. "Water-dispersible" means that the relevant component or ingredient of the composition of the invention can be dispersed in the aqueous phase and forms a stable emulsion or suspension.

The amphiphilic nonionic surfactant (B) comprises at least one hydrophobic group (b1). This means that the amphiphilic nonionic surfactant (B) can have more than one hydrophobic group (b1), e.g., 2, 3 or more groups (b1), which are separated from each other by at least one hydrophilic group (b2) hereinbelow described.

The hydrophobic group (b1) is preferably an alkyl group, more preferably an alkyl group having 4 to 40, most preferably 5 to 20, particularly preferably 7 to 18, in particular 10 to 16, for example 11 to 14 carbon atoms.

The amphiphilic nonionic surfactant (B) comprises at least one hydrophilic group (b2). This means that the amphiphilic nonionic surfactant (B) can contain more than one groups (b2), e.g., 2, 3 or more groups (b2) which are separated from each other by hydrophobic groups (b1).

Therefore, the amphiphilic nonionic surfactant (B) can have different blocklike general structures. Examples of such general blocklike structures are: (i) b1-b2; (ii) b1-b2-b1; (iii) b2-b1-b2; (iv) b2-b1-b2-b1; (v) b1-b2-b1-b2-b1; (vi) b2-b1-b2-b1-b2.

The hydrophilic group (b2) is selected from the group consisting of polyoxyalkylene groups comprising
(b22) oxyalkylene monomer units other than oxyethylene monomer units.

Preferably, the hydrophilic group (b2) is a hydrophilic group selected from the group consisting of polyoxyalkylene groups comprising
(b21) oxyalkylene monomer units, and
(b22) oxyalkylene monomer units other than oxyethylene monomer units,
said monomer units (b21) being not identical to monomer units (b22), and said polyoxyalkylene group of (b2) containing the monomer units (b21) and (b22) in random, alternating, gradient and/or block-like distribution.

More preferably, the hydrophilic group (b2) is a hydrophilic group selected from the group consisting of polyoxyalkylene groups comprising
(b21) oxyethylene monomer units, and
(b22) oxyalkylene monomer units other than oxyethylene monomer units,
said polyoxyalkylene group of (b2) containing the monomer units (b21) and (b22) in random, alternating, gradient and/or block-like distribution.

Said polyoxyalkylene groups can be oligomeric or polymeric.

In one embodiment, the oxyalkylene monomer units (b21) are preferably oxyethylene monomer units.

In another embodiment, the oxyalkylene monomer units (b21) are substituted oxyalkylene monomer units wherein the substituents are selected from the group consisting of alkyl, cycloalkyl, aryl, alkyl-cycloalkyl, alkyl-aryl, cycloalkyl-aryl and alkyl-cycloalkyl-aryl groups. The oxyalkylene monomer units (b21) are
more preferably either oxyethylene monomer units or derived from substituted oxiranes (X) wherein the substituents are selected from the group consisting of alkyl, cycloalkyl, aryl, alkyl-cycloalkyl, alkyl-aryl, cycloalkyl-aryl and alkyl-cycloalkyl-aryl groups,
most preferably derived from alkyl-substituted oxiranes (X),
particularly preferably derived from substituted oxiranes (X) wherein the substituents are selected from the group consisting of alkyl groups having 1 to 10 carbon atoms,
for example derived from methyl oxirane (propyleneoxide) and/or ethyl oxirane (butylene oxide).

Preferably, the oxyalkylene monomer units other than oxyethylene monomer units (b22) are substituted oxyalkylene monomer units wherein the substituents are selected from the group consisting of alkyl, cycloalkyl, aryl, alkyl-cycloalkyl, alkyl-aryl, cycloalkyl-aryl and alkyl-cycloalkyl-aryl groups. The oxyalkylene monomer units other than oxyethylene monomer units (b22) are
more preferably derived from substituted oxiranes (X) wherein the substituents are selected from the group consisting of alkyl, cycloalkyl, aryl, alkyl-cycloalkyl, alkyl-aryl, cycloalkyl-aryl and alkyl-cycloalkyl-aryl groups,
most preferably derived from alkyl-substituted oxiranes (X),
particularly preferably derived from substituted oxiranes (X) wherein the substituents are selected from the group consisting of alkyl groups having 1 to 10 carbon atoms,
for example derived from methyl oxirane (propyleneoxide) and/or ethyl oxirane (butylene oxide).

The substituents of the substituted oxiranes (X) themselves can also carry inert substituents, i.e., substituents which do not adversely affect the copolymerization of the oxiranes (X) and the surface activity of the amphiphilic non-ionic surfactants (B). Examples of such inert substituents are fluorine and chlorine atoms, nitro groups and nitrile groups. If such inert substituents are present, they are used in such amounts that they do not adversely affect the hydrophilic-hydrophobic balance of the amphiphilic non-ionic surfactant (B). Preferably, the substituents of the substituted oxiranes (X) do not carry such inert substituents.

The substituents of the substituted oxiranes (X) are preferably selected from the group consisting of alkyl groups having 1 to 10 carbon atoms, cycloalkyl groups having 5 to 10 carbon atoms in spirocyclic, exocyclic and/or annealed configuration, aryl groups having 6 to 10 carbon atoms, alkyl-cycloalkyl groups having 6 to 20 carbon atoms, alkyl-aryl groups having 7 to 20 carbon atoms, cycloalkyl-arylgroup 11 to 20 carbon atoms, and alkyl-cycloalkyl-aryl groups having 12 to 30 carbon atoms. Most preferably, the substituents of the substituted oxiranes (X) are selected from the group consisting of alkyl groups having 1 to 10 carbon atoms.

Examples for particularly preferred substituted oxiranes (X) are methyl, ethyl, 2,2- and 2,3-dimethyl, 2,2,3-trimethyl, 2,2,3,3-tetramethyl, 2-methyl-3-ethyl, 2,2 and 2,3-diethyl, n-propyl, 2-methyl-3-n-propyl, n-butyl, n-pentyl, n-hexyl, n-heptyl, n-octyl, n-nonyl, n-decyl, cyclopentyl, cyclohexyl, phenyl, and naphthyl oxirane; 1,2-epoxy-cyclohexane and -cyclopentane; 1-oxa-3-spiro[3.4]-heptane 1-oxa-3-spiro [3.5]-octane; and 1,2-epoxy-2,3-dihydroindene.

Examples for the most preferred substituted oxiranes (X) are methyl oxirane (propyleneoxide) and/or ethyl oxirane (butylene oxide), particularly methyl oxirane.

Most preferably, the hydrophilic group (b2) consists of the monomer units (b21) and (b22).

In the embodiments where the hydrophilic group (b2) comprises or consists of the monomer units (b21) and (b22), the polyoxyalkylene group—acting as hydrophilic group (b2)—contains the monomer units (b21) and (b22) in random, alternating, gradient and/or blocklike distribution. This means, that one hydrophilic group (b2) can have only one type of distribution, i.e., random: . . . -b21-b21-b22-b21-b22-b22-b22-b21-b22- . . . ;
alternating: . . . -b21-b22-b21-b22-b21- . . . ;
gradient: . . . b21-b21-b21-b22-b21-b22-b22-b21-b22-b22-b22- . . . ; or
blocklike: . . . -b21-b21-b21-b21-b22-b22-b22-b22- . . . .

In the embodiments where the hydrophilic group (b2) comprises or consists of the monomer units (b21) and (b22), the hydrophilic group (b2) can alternatively also contain at least two types of distributions, e.g., an oligomeric or polymeric segment having a random distribution and an oligomeric or polymeric segment having alternating distribution. Most preferably, the hydrophilic group (b2) preferably has only one type of distribution, and most preferably, said distribution is random or blocklike.

In the embodiments where the hydrophilic group (b2) comprises or consists of the monomer units (b21) and (b22), the molar ratio of (b21) to (b22) can vary broadly and, therefore, can be adjusted most advantageously to the particular requirements of the composition, the process and the use of the invention. Preferably the molar ratio (b21):(b22) is from 100:1 to 1:1, more preferably, from 60:1 to 1.5:1 and, most preferably, from 50:1 to 1.5:1, and particularly preferably, from 25:1 to 1.5:1, and particularly, from 15:1 to 2:1, and for example, from 9:1 to 2:1.

Also the degree of polymerization of the oligomeric and polymeric polyoxyalkylene groups—acting as hydrophilic groups (b2)—can vary broadly and, therefore, can be adjusted most advantageously to the particular requirements of the composition, the process and the use of the invention. Preferably, the degree of polymerization is in the range of from 5 to 100, preferably 5 to 90, and most preferably, 5 to 80.

Particularly, the amphiphilic non-ionic surfactant (B) is an amphiphilic non-ionic polyoxyethylene-polyoxypropylene alkyl ether surfactant which is a mixture of molecules containing, on the average, an alkyl group having 10 to 16 carbon atoms and 5 to 20 oxyethylene monomer units (b21) and 2 to 8 oxypropylene monomer units (b22) in random distribution. For example, the amphiphilic non-ionic surfactant (B) is an amphiphilic non-ionic polyoxyethylene-polyoxypropylene alkyl ether surfactant which is a mixture of molecules containing, on the average, an alkyl group having 11 to 14 carbon atoms and 12 to 20 oxyethylene monomer units (b21) and 3 to 5 oxypropylene monomer units (b22) in random distribution.

The amphiphilic non-ionic surfactant (B) can be contained in varying amounts in the CMP composition (Q1). Preferably, the amount of (B) is not more than 10 wt. %, more preferably not more than 3 wt. %, most preferably not more than 1 wt. %, particularly preferably not more than 0.5 wt. %, particularly not more than 0.25 wt. %, for example not more than 0.15 wt. %, based on the total weight of the composition (Q1). Preferably, the amount of (B) is at least 0.0001 wt. %, more preferably at least 0.001 wt. %, most preferably at least 0.008 wt. %, particularly preferably at least 0.02 wt. %, particularly at least 0.05 wt. %, for example at least 0.08 wt. %, based on the total weight of the composition (Q1).

Generally, the amphiphilic non-ionic surfactant (B) can have different weight average molecular weights. The weight average molecular weight of (B) is preferably at least 300, more preferably at least 500, most preferably at least 700, particularly at least 800, for example at least 900. The weight average molecular weight of (B) is preferably not more than 15,000, more preferably not more than 6,000, most preferably not more than 3,000, particularly not more than 2,000, for example not more than 1,400 [g/mol], as determined by gel permeation chromatography (abbreviated as "GPC" in the following). In particular, the weight average molecular weight of (B) is from 900 to 1,400 [g/mol] as determined by GPC. Said GPC are standard GPC techniques known to the person skilled of the art.

In general, the solubility of amphiphilic non-ionic surfactant (B) in an aqueous medium can vary within a wide range. The solubility of (B) in water at pH 7 at 25° C. under atmospheric pressure is preferably at least 1 g/L, more preferably at least 5 g/L, most preferably at least 20 g/L, particularly at least 50 g/L, for example at least 150 g/L. Said solubility can be determined by evaporating the solvent and measuring the remaining mass in the saturated solution.

The CMP composition (Q2) comprises at least one amphiphilic non-ionic polyoxyethylene surfactant (C) having
(c1) at least one hydrophobic group which is an alkyl group having not more than 8 carbon atoms; and
(c2) at least one hydrophilic group which is a polyoxyethylene group;

The amphiphilic non-ionic polyoxyethylene surfactant (C) is preferably water-soluble and/or water-dispersible, more preferably water-dispersible. "Water-soluble" means that the relevant component or ingredient of the composition of the invention can be dissolved in the aqueous phase on the molecular level. "Water-dispersible" means that the relevant component or ingredient of the composition of the invention can be dispersed in the aqueous phase and forms a stable emulsion or suspension.

The amphiphilic nonionic polyoxyethylene surfactant (C) comprises at least one hydrophobic group (c1). This means that (C) can have more than one hydrophobic group (c1), e.g., 2, 3 or more groups (c1), which are separated from each other by at least one hydrophilic group (c2) hereinbelow described.

The hydrophobic group (c1) is an alkyl group having not more than 8 carbon atoms, preferably an alkyl group having not more than 7 carbon atoms, more preferably an alkyl group having 3 to 7 carbon atoms, most preferably 4 to 7 carbon atoms, particularly 5 to 6 carbon atoms.

The amphiphilic nonionic polyoxyethylene surfactant (C) comprises at least one hydrophilic group (c2). This means that the amphiphilic nonionic surfactant (C) can contain more than one group (c2), e.g., 2, 3 or more groups (c2) which are separated from each other by hydrophobic groups (c1).

Therefore, the amphiphilic nonionic polyoxyethylene surfactant (C) can have different blocklike general structures. Examples of such general blocklike structures are:

c1-c2,
c1-c2-c1,
c2-c1-c2,
c2-c1-c2-c1,
c1-c2-c1-c2-c1, and
c2-c1-c2-c1-c2.

The hydrophilic group (c2) is a polyoxyethylene group which can be oligomeric or polymeric.

The degree of polymerization of the oligomeric and polymeric polyoxyethylene groups—acting as hydrophilic groups (c2)—can vary broadly and, therefore, can be adjusted most advantageously to the particular requirements of the composition, the process and the use of the invention. Preferably, the degree of polymerization is in the range of from 5 to 100, preferably 5 to 90, and most preferably, 5 to 80.

The amphiphilic non-ionic polyoxyethylene surfactant (C) can be contained in varying amounts in the CMP composition (Q2). Preferably, the amount of (C) is not more than 10 wt. %, more preferably not more than 3 wt. %, most preferably not more than 1 wt. %, particularly preferably not more than 0.5 wt. %, particularly not more than 0.25 wt. %, for example not more than 0.15 wt. %, based on the total weight of the composition (Q2). Preferably, the amount of (C) is at least 0.0001 wt. %, more preferably at least 0.001 wt. %, most preferably at least 0.008 wt. %, particularly preferably at least 0.02 wt. %, particularly at least 0.05 wt. %, for example at least 0.08 wt. %, based on the total weight of the composition (Q2).

Generally, the amphiphilic non-ionic polyoxyethylene surfactant (C) can have different weight average molecular weights. The weight average molecular weight of (C) is preferably at least 100, more preferably at least 150, most preferably at least 200, particularly at least 250, for example at least 300. The weight average molecular weight of (C) is preferably not more than 10,000, more preferably not more than 3,000, most preferably not more than 1,000, particularly not more than 700, for example not more than 400 [g/mol], as determined by gel permeation chromatography (abbreviated as "GPC" in the following). In particular, the weight average molecular weight of (C) is from 200 to 1,000 [g/mol] as determined by GPC. Said GPC are standard GPC techniques known to the person skilled in the art.

In general, the solubility of amphiphilic non-ionic polyoxyethylene surfactant (C) in an aqueous medium can vary within a wide range. The solubility of (C) in water at pH 7 at 25° C. under atmospheric pressure is preferably at least 1 g/L, more preferably at least 5 g/L, most preferably at least 20 g/L, particularly at least 50 g/L, for example at least 150 g/L. Said solubility can be determined by evaporating the solvent and measuring the remaining mass in the saturated solution. According to the invention, the CMP composition (Q1) or (Q2) contains an aqueous medium (M). (M) can be of one type or a mixture of different types of aqueous media.

In general, the aqueous medium (M) can be any medium which contains water. Preferably, the aqueous medium (M) is a mixture of water and an organic solvent miscible with water (e.g. an alcohol, preferably a $C_1$ to $C_3$ alcohol, or an alkylene glycol derivative). More preferably, the aqueous medium (M) is water. Most preferably, aqueous medium (M) is de-ionized water.

If the amounts of the components other than (M) are in total y % by weight of the CMP composition, then the amount of (M) is (100−y) % by weight of the CMP composition.

The aqueous medium (M) can be contained in varying amounts in the CMP composition (Q1) or (Q2). Preferably, the amount of (M) is not more than 99.9 wt. %, more preferably not more than 99.7 wt. %, most preferably not more than 99.5 wt. %, particularly preferably not more than 99 wt. %, particularly not more than 98.5 wt. %, for example not more than 98 wt. %, based on the total weight of the composition (Q1) or (Q2). Preferably, the amount of (M) is at least 60 wt. %, more preferably at least 70 wt. %, most preferably at least 80 wt. %, particularly preferably at least 90 wt. %, particularly at least 93 wt. %, for example at least 96 wt. %, based on the total weight of the composition (Q1) or (Q2).

The CMP composition (Q1) or (Q2) can further optionally comprise at least one type of oxidizing agent (D), preferably one to two types of oxidizing agent (D), more preferably one type of oxidizing agent (D). In case of composition (Q1), the oxidizing agent (D) is different from the components (A) and (B). In case of composition (Q2), the oxidizing agent (D) is different from the components (A) and (C). In general, the oxidizing agent is a compound which is capable of oxidizing the to-be-polished substrate or one of its layers. Preferably, (D) is a per-type oxidizer. More preferably, (D) is a peroxide, persulfate, perchlorate, perbromate, periodate, permanganate, or a derivative thereof. Most preferably, (D) is a peroxide or persulfate. Particularly, (D) is a peroxide. For example, (D) is hydrogen peroxide.

If present, the oxidizing agent (D) can be contained in varying amounts in the CMP composition (Q1) or (Q2). Preferably, the amount of (D) is not more than 20 wt. %, more preferably not more than 10 wt. %, most preferably not more than 5 wt. %, particularly not more than 3.5 wt. %, for example not more than 2.7 wt. %, based on the total weight of the composition (Q1) or (Q2). Preferably, the amount of (D) is at least 0.01 wt. %, more preferably at least 0.08 wt. %, most preferably at least 0.4 wt. %, particularly at least 0.75 wt. %, for example at least 1 wt. %, based on the total weight of the composition (Q1) or (Q2). If hydrogen peroxide is used as oxidizing agent (D), the amount of (D) is preferably 1 wt. % to 5 wt. %, more preferably 2 wt. % to 3.5 wt. %, for instance 2.5 wt. %, based on the total weight of the composition (Q1) or (Q2).

The CMP composition (Q1) or (Q2) can further optionally contain at least one biocide (E), for example one biocide. In case of composition (Q1), the biocide (E) is different from the components (A) and (B). In case of composition (Q2), the biocide (E) is different from the components (A) and (C). In general, the biocide is a compound which deters, renders harmless, or exerts a controlling effect on any harmful organism by chemical or biological means. Preferably, (E) is an quaternary ammonium compound, an isothiazolinone-based compound, an N-substituted diazenium dioxide, or an N-hydroxy-diazenium oxide salt. More preferably, (E) is an N-substituted diazenium dioxide, or an N-hydroxy-diazenium oxide salt.

If present, the biocide (E) can be contained in varying amounts. If present, the amount of (E) is preferably not more than 0.5 wt. %, more preferably not more than 0.1 wt. %, most preferably not more than 0.05 wt. %, particularly not more than 0.02 wt. %, for example not more than 0.008 wt. %, based on the total weight of the corresponding composition. If present, the amount of (E) is preferably at least 0.0001 wt. %, more preferably at least 0.0005 wt. %, most preferably at least 0.001 wt. %, particularly at least 0.003 wt. %, for example at least 0.006 wt. %, based on the total weight of the corresponding composition (Q1) or (Q2).

The CMP composition (Q1) or (Q2) can further optionally contain at least one corrosion inhibitor (F), for example one corrosion inhibitor. In case of composition (Q1), the corrosion inhibitor (F) is different from the components (A) and (B). In case of composition (Q2), the corrosion inhibitor (F) is different from the components (A) and (C). In general, all compounds forming a protective molecular layer on the surface of a III-V material—for example GaAs—can be used as corrosion inhibitor. Preferred corrosion inhibitors (F) are thiols, film forming polymers, polyols, diazoles, triazoles, tetrazoles, and their derivatives, for example benzotriazole or tolyltriazole.

If present, the corrosion inhibitor (F) can be contained in varying amounts. If present, the amount of (F) is preferably not more than 10 wt. %, more preferably not more than 2 wt. %, most preferably not more than 0.5 wt. %, particularly not more than 0.1 wt. %, for example not more than 0.05 wt. %, based on the total weight of the corresponding composition. If present, the amount of (F) is preferably at least 0.0005 wt. %, more preferably at least 0.005 wt. %, most preferably at least 0.025 wt. %, particularly at least 0.1 wt. %, for example at least 0.4 wt. %, based on the total weight of the corresponding composition (Q1) or (Q2).

The properties of the CMP composition (Q1) or (Q2), such as stability and polishing performance, may depend on the pH of the corresponding composition. In general, the CMP composition (Q1) or (Q2) can have any pH value. The pH value of the composition (Q1) or (Q2) is preferably not more than 9, more preferably not more than 9, most preferably not more than 8, particularly preferably not more than 7, particularly most preferably not more than 6, particularly not more than 5, for example not more than 4.5. The pH value of the composition (Q1) or (Q2) is preferably at least 0, more preferably at least 1, most preferably at least 1.5, particularly preferably at least 2, particularly most preferably at least 2.5, particularly at least 3, for example at least 3.5. The pH value of the composition (Q1) or (Q2) is preferably in the range of from 0 to 9, more preferably from 1 to 8, most preferably from 2 to 7, particularly preferably from 2.5 to 5.5, particularly most preferably from 3 to 5, particularly from 3.5 to 4.5, for example from 3.8 to 4.2.

The CMP composition (Q1) or (Q2) can further optionally contain at least one pH adjusting agent (G). In case of composition (Q1), the pH adjusting agent (G) is different from the components (A) and (B). In case of composition (Q2), the pH adjusting agent (G) is different from the components (A) and (C). In general, the pH adjusting agent (G) is a compound which is added to the CMP composition (Q1) or (Q2) to have its pH value adjusted to the required value. Preferably, the CMP composition (Q1) or (Q2) contains at least one pH adjusting agent (G). Preferred pH adjusting agents are inorganic acids, carboxylic acids, amine bases, alkali hydroxides, ammonium hydroxides, including tetraalkylammonium hydroxides. For example, the pH adjusting agent (G) is nitric acid, sulfuric acid, ammonia, sodium hydroxide, or potassium hydroxide.

If present, the pH adjusting agent (G) can be contained in varying amounts. If present, the amount of (G) is preferably not more than 10 wt. %, more preferably not more than 2 wt. %, most preferably not more than 0.5 wt. %, particularly not more than 0.1 wt. %, for example not more than 0.05 wt. %, based on the total weight of the corresponding composition. If present, the amount of (G) is preferably at least 0.0005 wt. %, more preferably at least 0.005 wt. %, most preferably at least 0.025 wt. %, particularly at least 0.1 wt. %, for example at least 0.4 wt. %, based on the total weight of the corresponding composition (Q1) or (Q2).

The CMP composition (Q1) or (Q2) may also contain, if necessary, at least one other additive, including but not limited to stabilizers, surfactants, friction reducing agents, etc. In case of composition (Q1), said other additive is different from the components (A) and (B). In case of composition (Q2), said other additive is different from the components (A) and (C). Said other additives are for instance those commonly employed in CMP compositions and thus known to the person skilled in the art. Such addition can for example stabilize the dispersion, or improve the polishing performance, or the selectivity between different layers.

If present, said other additive can be contained in varying amounts. Preferably, the total amount of said other additives is not more than 10 wt. %, more preferably not more than 2 wt. %, most preferably not more than 0.5 wt. %, particularly not more than 0.1 wt. %, for example not more than 0.01 wt. %, based on the total weight of the corresponding CMP composition. Preferably, the total amount of said other additives is at least 0.0001 wt. %, more preferably at least 0.001 wt. %, most preferably at least 0.008 wt. %, particularly at least 0.05 wt. %, for example at least 0.3 wt. %, based on the total weight of the corresponding composition (Q1) or (Q2).

According to the preferred embodiment (PE1), a process for the manufacture of semiconductor devices comprising the chemical-mechanical polishing of a substrate or layer containing GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, or GaInAsSb was carried out in the presence of a CMP composition (Q1) comprising
(A) silica particles,
(B) at least one amphiphilic non-ionic surfactant having
   (b1) at least one hydrophobic group which is an alkyl group; and
   (b2) at least one hydrophilic group selected from the group consisting of polyoxyalkylene groups comprising
     (b21) oxyethylene monomer units and
     (b22) oxyalkylene monomer units other than oxyethylene monomer units, wherein the oxyalkylene monomer units are derived from substituted oxiranes (X) wherein the substituents are selected from the group consisting of alkyl groups having 1 to 10 carbon atoms,
   the said polyoxyalkylene group of (b2) containing the monomer units (b21) and (b22) in random, alternating, gradient and/or blocklike distribution, and
(M) an aqueous medium.

According to the preferred embodiment (PE2), a process for the manufacture of semiconductor devices comprising the chemical-mechanical polishing of a substrate or layer containing GaAs was carried out in the presence of a CMP composition (Q1) comprising
(A) silica particles,
(B) at least one amphiphilic non-ionic surfactant having
   (b1) at least one hydrophobic group which is an alkyl group having 5 to 20 carbon atoms; and
   (b2) at least one hydrophilic group selected from the group consisting of polyoxyalkylene groups comprising
     (b21) oxyethylene monomer units and
     (b22) oxyalkylene monomer units other than oxyethylene monomer units, wherein the oxyalkylene monomer units are derived from substituted oxiranes (X) wherein the substituents are selected from the group consisting of alkyl groups having 1 to 10 carbon atoms,
   the said polyoxyalkylene group of (b2) containing the monomer units (b21) and (b22) in random, alternating, gradient and/or blocklike distribution, and (M) an aqueous medium.

According to the preferred embodiment (PE3), a process for the manufacture of semiconductor devices comprising the chemical-mechanical polishing of a substrate or layer containing GaAs was carried out in the presence of a CMP composition (Q1) comprising
(A) inorganic particles, organic particles, or a mixture or composite thereof,
(B) at least one amphiphilic non-ionic surfactant having
 (b1) at least one hydrophobic group which is an alkyl group having 5 to 20 carbon atoms; and
 (b2) at least one hydrophilic group selected from the group consisting of polyoxyalkylene groups comprising
  (b21) oxyethylene monomer units and
  (b22) oxyalkylene monomer units other than oxyethylene monomer units, wherein the oxyalkylene monomer units are derived from methyl oxirane (propylene oxide) and/or ethyl oxirane (butylene oxide),
  the said polyoxyalkylene group of (b2) containing the monomer units (b21) and (b22) in random, alternating, gradient and/or blocklike distribution, and
(M) an aqueous medium.

According to the preferred embodiment (PE4), a process for the manufacture of semiconductor devices comprising the chemical-mechanical polishing of a substrate or layer containing GaAs was carried out in the presence of a CMP composition (Q1) comprising
(A) silica particles,
(B) at least one amphiphilic non-ionic surfactant having
 (b1) at least one hydrophobic group which is an alkyl group having 5 to 20 carbon atoms; and
 (b2) at least one hydrophilic group selected from the group consisting of polyoxyalkylene groups comprising
  (b21) oxyethylene monomer units and
  (b22) oxyalkylene monomer units other than oxyethylene monomer units, wherein the oxyalkylene monomer units are derived from methyl oxirane (propylene oxide) and/or ethyl oxirane (butylene oxide),
  the said polyoxyalkylene group of (b2) containing the monomer units (b21) and (b22) in random, alternating, gradient and/or blocklike distribution,
(D) an oxidizing agent, and
(M) an aqueous medium.

According to the preferred embodiment (PE5), a process for the manufacture of semiconductor devices comprising the chemical-mechanical polishing of a substrate or layer containing GaAs was carried out in the presence of a CMP composition (Q1) having a pH value in the range of from 1 to 8 and comprising
(A) silica particles,
(B) at least one amphiphilic non-ionic surfactant having
 (b1) at least one hydrophobic group which is an alkyl group having 5 to 20 carbon atoms; and
 (b2) at least one hydrophilic group selected from the group consisting of polyoxyalkylene groups comprising
  (b21) oxyethylene monomer units and
  (b22) oxyalkylene monomer units other than oxyethylene monomer units, wherein the oxyalkylene monomer units are derived from methyl oxirane (propylene oxide) and/or ethyl oxirane (butylene oxide),
  the said polyoxyalkylene group of (b2) containing the monomer units (b21) and (b22) in random, alternating, gradient and/or blocklike distribution,
(D) an oxidizing agent, and
(M) an aqueous medium.

According to the preferred embodiment (PE6), a process for the manufacture of semiconductor devices comprising the chemical-mechanical polishing of a substrate or layer containing GaAs was carried out in the presence of a CMP composition (Q2) comprising
(A) silica particles,
(C) at least one amphiphilic non-ionic polyoxyethylene surfactant having
 (c1) at least one hydrophobic group which is an alkyl group having 4 to 7 carbon atoms; and
 (c2) at least one hydrophilic group which is a polyoxyethylene group;
(D) hydrogen peroxide as oxidizing agent, and
(M) an aqueous medium.

Processes for preparing CMP compositions are generally known. These processes may be applied to the preparation of the CMP composition (Q1) or (Q2). This can be carried out by dispersing or dissolving the above-described components (A) and (B) in the aqueous medium (M), preferably water, and optionally by adjusting the pH value through adding an acid, a base, a buffer or an pH adjusting agent. For this purpose the customary and standard mixing processes and mixing apparatuses such as agitated vessels, high shear impellers, ultrasonic mixers, homogenizer nozzles or counterflow mixers, can be used.

The CMP composition (Q1) is preferably prepared by dispersing the particles (A), dispersing and/or dissolving the amphiphilic non-ionic surfactant (B) and optionally other additives in the aqueous medium (M). The CMP composition (Q2) is preferably prepared by dispersing the particles (A), dispersing and/or dissolving the amphiphilic non-ionic polyoxyethylene surfactant (C) and optionally other additives in the aqueous medium (M).

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention, the CMP composition (Q1) or (Q2) is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded to a certain degree independently from each other.

For further details reference is made to WO 2004/063301 A1, in particular page 16, paragraph [0036] to page 18, paragraph [0040] in conjunction with the FIG. 2.

By way of the CMP process of the invention, wafers with integrated circuits comprising a dielectric layer can be obtained which have an excellent functionality.

The CMP composition (Q1) or (Q2) can be used in the CMP process as ready-to-use slurry, they have a long shelf-life and show a stable particle size distribution over long time. Thus, they are easy to handle and to store. They show an excellent polishing performance, particularly with regard to the low static etch rate combined with minimal generation of the toxic gas $AsH_3$. Since the amounts of its components are held down to a minimum, the CMP composition (Q1) or (Q2) and the CMP process according to the invention can be used or applied in a cost-effective way.

EXAMPLES AND COMPARATIVE EXAMPLES

General Procedure for the CMP Experiments

For the evaluation on benchtop polisher, the following parameters were chosen:

Procedure setting: Power Pro 5000 polisher; table/carrier 200/150 rpm; down force 2.5 psi (17238 Pa); slurry flow rate 20 mL/min; pad IC 1000; polishing time 3 min for comparative examples V1-V2 and examples 1 and 2; slurry flow rate 18 mL/min; pad IC 1000; polishing time 1 min for comparative examples V3-V6 and examples 3 and 4.

The pad is conditioned by several sweeps, before a new type of CMP composition is used for CMP. For the determination of removal rates at least 3 wafers are polished and the data obtained from these experiments are averaged.

The CMP composition is stirred in the local supply station.
Object to be Polished: Unstructured GaAs Wafer The GaAs material removal rates (referred to as "GaAs-MRR" in the following) for 2 inch (=5.08 cm) discs polished by the CMP composition are determined by difference of weight of the coated wafers or blanket discs before and after CMP, using a Sartorius LA310 S scale. The difference of weight can be converted into the difference of film thickness since the density (5.32 $g/cm^3$ for GaAs) and the surface area of the polished material are known. Dividing the difference of film thickness by the polishing time provides the values of the material removal rate.

The hot static etching rate of the GaAs layer (referred to as "GaAs-hSER" in the following) is determined by dipping 1×1 inch (2.54×2.54 cm) GaAs coupon into the corresponding composition for 5 minutes at 60° C. and measuring the loss of mass before and after the dipping.

The amount of generated $AsH_3$ gas was determined by a mobile hydride detector from the company Dräger, which was mouted 10 cm above the polishing pad. The device has a digital display showing the current concentration of $AsH_3$ in the atmosphere.
Object to be Polished: Unstructured $SiO_2$ Wafer The $SiO_2$ material removal rates (referred to as "Oxide-MRR" in the following) for 2 inch (=5.08 cm) discs polished by the CMP composition are determined by difference of weight of the coated wafers or blanket discs before and after CMP, using a Sartorius LA310 S scale. The difference of weight can be converted into the difference of film thickness since the density (1.9 $g/cm^3$ for $SiO_2$) and the surface area of the polished material are known. Dividing the difference of film thickness by the polishing time provides the values of the material removal rate.

Silica particles used as particles (A) are of NexSil™ (Nyacol) type. NexSil™ 125K are potassium-stabilized colloidal silica having a typical particle size of 85 nm and a typical surface area of 35 $m^2/g$.

(Z) is an amphiphilic non-ionic polyoxyethylene-polyoxypropylene alkyl ether surfactant which is a mixture of molecules containing, on the average, an alkyl group having 11 to 14 carbon atoms and 12 to 20 oxyethylene monomer units and 3 to 5 oxypropylene monomer units in random distribution. The weight average molecular weight of (Z) is from 900 to 1,500 [g/mol].

Emulan HE 50 is an amphiphilic non-ionic polyoxyethylene alkyl ether surfactant and is a $C_4$-$C_8$ alcohol which has been reacted with 5 ethylene oxide units (see US 2007/0185256 A1).

Standard Procedure for Slurry Preparation:

The components (A), (B) or (C), and (D)—each in the amounts as indicated in Table 1 and Table 2—were dispersed or dissolved in de-ionized water. pH is adjusted by adding of aqueous 10% KOH solution or $HNO_3$ (0.1%-10%) solution to the slurry. The pH value is measured with a pH electrode (Schott, blue line, pH 0-14/−5 . . . 100° C./3 mol/L sodium chloride).

Examples 1, 2, 3 and 4 (Compositions used in the process of the invention) and Comparative Examples V1, V2 and V3 (comparative composition) and V4-V6 (different polishing substrate).

An aqueous dispersion containing the components as listed in Table 1 was prepared, furnishing the CMP compositions of the Examples 1, 2, 3 and 4 and the comparative example V1, V2 and V3.

The formulation and polishing performance data and of the CMP compositions of the Example 1, 2, 3 and 4 and of the comparative examples V1, V2 and V3 are indicated in the Table 1:

TABLE 1

CMP compositions of the examples 1 to 4 and of the comparative examples V1 to V3, their pH values, GaAs-hSER data as well as their GaAs-MRR in the process of chemical-mechanical polishing of 2 inch (=5.08 cm) unstructured GaAs wafers using these compositions, wherein the aqueous medium (M) of the CMP compositions is de-ionized water. The amounts of the components (A), (B), (C) and (D) are specified in weight percent (wt. %) by weight of the corresponding CMP composition. If the amounts of the components other than (M) are in total y % by weight of the CMP composition, then the amount of (M) is (100 − y) % by weight of the CMP composition.

|  | Comparative Example V1 | Comparative Example V2 | Example 1 | Example 2 |
|---|---|---|---|---|
| Particles (A) | NexSil ™ 125K 1.5 wt. % | NexSil ™ 125K 1.0 wt. % | NexSil ™ 125K 1.0 wt. % | NexSil ™ 125K 0.5 wt. % |
| Amphiphilic non-ionic surfactant (B) | — | — | (Z) 0.1 wt. % | — |
| Amphiphilic non-ionic polyoxyethylene surfactant (C) | — | — | — | Emulan HE50 0.1 wt. % |
| Oxidizing agent (D) | $H_2O_2$ 2.5 wt. % | $H_2O_2$ 2.5 wt. % | $H_2O_2$ 1.5 wt. % | $H_2O_2$ 1.5 wt. % |
| pH | 4 | 4 | 4 | 4 |
| GaAs-MRR [Å/min] | 1751 | 1741 | 1239 | 636 |

TABLE 1-continued

CMP compositions of the examples 1 to 4 and of the comparative examples V1 to V3, their pH values, GaAs-hSER data as well as their GaAs-MRR in the process of chemical-mechanical polishing of 2 inch (=5.08 cm) unstructured GaAs wafers using these compositions, wherein the aqueous medium (M) of the CMP compositions is de-ionized water. The amounts of the components (A), (B), (C) and (D) are specified in weight percent (wt. %) by weight of the corresponding CMP composition. If the amounts of the components other than (M) are in total y % by weight of the CMP composition, then the amount of (M) is (100 − y) % by weight of the CMP composition.

| | | | | |
|---|---|---|---|---|
| GaAs-hSER [Å/min] | 44 | Not determined | −3 | 4 |
| AsH₃ generation [ppm] | 0.06 | Not determined | 0.03 | 0.03 |

| | Comparative Example V3 | Example 3 | Example 4 |
|---|---|---|---|
| Particles (A) | NexSil ™ 125K 1.5 wt. % | NexSil ™ 125K 1.5 wt. % | NexSil ™ 125K 1.5 wt. % |
| Amphiphilic non-ionic surfactant (B) | — | (Z) 0.1 wt. % | — |
| Amphiphilic non-ionic polyoxyethylene surfactant (C) | — | — | Emulan HE50 0.1 wt. % |
| Oxidizing agent (D) | $H_2O_2$ 1.5 wt. % | $H_2O_2$ 1.5 wt. % | $H_2O_2$ 1.5 wt. % |
| pH | 4 | 4 | 4 |
| GaAs-MRR [Å/min] | 2078 | 754 | 1061 |
| GaAs-hSER [Å/min] | 18 | 16 | 10 |
| AsH₃ generation [ppm] | 0.06 | 0.03 | 0.03 |

An aqueous dispersion containing the components as listed in Table 2 was prepared, furnishing the CMP compositions of the comparative examples V4, V5 and V6.

The formulation and polishing performance data and of the CMP compositions of the comparative examples V4, V5 and V6 are indicated in the Table 2

TABLE 2

CMP compositions of the comparative example V4, V5 and V6, their pH values and their Oxide-MRR in the process of chemical-mechanical polishing of 2 inch (=5.08 cm) unstructured SiO₂ wafers using these compositions, wherein the aqueous medium (M) of the CMP compositions is de-ionized water. The amounts of the components (A), (B), (C) and (D) are specified in weight percent (wt. %) by weight of the corresponding CMP composition. If the amounts of the components other than (M) are in total y % by weight of the CMP composition, then the amount of (M) is (100 − y) % by weight of the CMP composition.

| | Comparative Example V4 | Comparative Example V5 | Comparative Example V6 |
|---|---|---|---|
| Particles (A) | NexSil ™ 125K 1.0 wt. % | NexSil ™ 125K 1.0 wt. % | NexSil ™ 125K 1.0 wt. % |
| Amphiphilic non-ionic surfactant (B) | — | (Z) 0.1 wt. % | — |
| Amphiphilic non-ionic polyoxyethylene surfactant (C) | — | — | Emulan HE50 0.1 wt. % |
| Oxidizing agent (D) | $H_2O_2$ 1.5 wt. % | $H_2O_2$ 1.5 wt. % | $H_2O_2$ 1.5 wt. % |
| pH | 4 | 4 | 4 |
| Oxide-MRR [Å/min] | 71 | 18 | 152 |

The CMP process of the invention using Examples 1, 2, 3 and 4 of the CMP composition shows an improved polishing performance as indicated by a decreased hot static etching rate of the GaAs layer (GaAs-hSER) and a decreased AsH₃ gas formation tendency.

The invention claimed is:

1. A process for manufacturing semiconductor devices, the process comprising:
   chemical-mechanically polishing a substrate or a layer comprising a III-V material in the presence of a chemical-mechanical polishing composition (Q1), which comprises
   (A) inorganic particles, organic particles, or a mixture or a composite thereof,
   (B) an amphiphilic non-ionic surfactant comprising
   (b1) a hydrophobic group; and
   (b2) a hydrophilic group, which is a polyoxyalkylene group comprising
   (b22) oxyalkylene monomer units derived from substituted oxiranes (X), which comprise substituents of alkyl groups comprising 1 to 10 carbon atoms; and
   (M) an aqueous medium;
   wherein a pH of the polishing composition (Q1) is from 1 to 7.

2. The process according to claim 1, wherein the III-V material is GaN, GaP, GaAs, GaSb, AlAs, AlN, InP, InAs, InSb, InGaAs, InAlAs, AlGaAs, GaAlN, GaTnN, InGaAlAs, InGaAsP, InGaP, AlInP, GaAlSb, GaInSb, GaAlAsSb, or GaInAsSb.

3. The process according to claim 1, wherein the III-V material is GaAs.

4. The process according to claim 1, wherein
   the oxyalkylene monomer units (b21) and (b22) are distributed in a random, an alternating, a gradient and/or a block-like manner.

5. The process according to claim 1, wherein
   the hydrophilic group
   (b21) comprises oxyethylene monomer units, and
   the oxyethylene monomer units (b21) and the oxyalkylene monomer units (b22) are distributed in a random, an alternating, a gradient and/or a block-like manner.

6. The process according to claim 1, wherein the composition (Q1) has a pH value of from 2.5 to 5.5.

7. The process according to claim 1, wherein the composition (Q1) further comprises
   (D) an oxidizing agent.

8. The process according to claim 1, wherein the hydrophobic group (b1) is an alkyl group comprising 5 to 20 carbon atoms.

9. The process according to claim 1, wherein
   the oxyalkylene monomer unit derived from substituted oxiranes (X), which comprise substituents of alkyl comprising 1 to 10 carbon atoms is at least one of methyl oxirane and ethyl oxirane.

10. The process according to claim 1, wherein the particles (A) are silica particles.

11. The process according to claim 1, wherein the composition (Q1) comprises
    (A) silica particles,
    (B) an amphiphilic non-ionic surfactant comprising
       (b1) a hydrophobic group which is an alkyl group comprising 5 to 20 carbon atoms; and
       (b2) a hydrophilic group, which is a polyoxyalkylene group comprising
          (b21) oxyethylene monomer units and
          (b22) oxyalkylene monomer units derived from substituted oxiranes (x) is at least one of methyl oxirane and/or ethyl oxirane, (D) an oxidizing agent, and
(M) an aqueous medium,
wherein the oxyethylene monomer units (b21) and the oxyalkylene monomer units (b22) are distributed in a random, an alternating, a gradient and/or a block-like manner.

12. A process for chemical-mechanically polishing a substrate or a layer, the process comprising:
chemical-mechanically the substrate or the layer with a chemical-mechanical polishing composition (Q1),
wherein
the composition (Q1) comprises
(A) inorganic particles, organic particles, or a mixture or composite thereof,
(B) amphiphilic non-ionic surfactant comprising
  (b1) a hydrophobic alkyl group of 5 to 20 carbon atoms; and
  (b2) a hydrophilic group, which is a polyoxyalkylene group comprising
    (b22) oxyalkylene monomer units derived from substituted oxiranes (X), which comprise substituents of alkyl groups comprising 1 to 10 carbon atoms; and
(M) an aqueous medium,
wherein a pH of the polishing composition (Q1) is from 0 to 7, and
the substrate or the layer comprises a III-V material.

* * * * *